(12) United States Patent
Watterson et al.

(10) Patent No.: US 6,665,076 B1
(45) Date of Patent: Dec. 16, 2003

(54) WAVELENGTH REFERENCE DEVICE

(75) Inventors: Reich Watterson, Lexington, MA (US); Parviz Tayebati, Boston, MA (US)

(73) Assignee: CoreTek, Inc., Billerica, MA (US)

( * ) Notice: Subject to any disclaimer, the term of this patent is extended or adjusted under 35 U.S.C. 154(b) by 0 days.

(21) Appl. No.: 09/644,783

(22) Filed: Aug. 23, 2000

Related U.S. Application Data

(60) Provisional application No. 60/150,241, filed on Aug. 23, 1999.

(51) Int. Cl.[7] .................................................. G01B 9/02
(52) U.S. Cl. ........................................ 356/454; 356/519
(58) Field of Search ................................. 356/450, 519, 356/454; 372/32, 28

(56) References Cited

U.S. PATENT DOCUMENTS

| | | | |
|---|---|---|---|
| 4,319,843 A | | 3/1982 | Gornall |
| 4,426,155 A | | 1/1984 | Monchalin |
| 4,444,501 A | * | 4/1984 | Schwiesow .................. 356/452 |
| 5,146,284 A | | 9/1992 | Tabarelli et al. |
| 5,546,184 A | | 8/1996 | Downs |
| 5,671,047 A | | 9/1997 | Curbelo |
| 6,043,883 A | | 3/2000 | Leckel et al. |

* cited by examiner

Primary Examiner—Samuel A. Turner
Assistant Examiner—Patrick Connolly
(74) Attorney, Agent, or Firm—Pandiscio & Pandiscio, P.C.

(57) ABSTRACT

A wavelength reference device for tuning a tunable Fabry-Perot filter and/or a tunable VCSEL to a desired frequency, where the device uses a modified Michelson interferometer to generate a series of reference frequencies

16 Claims, 8 Drawing Sheets

BY CAREFUL ATTENTION TO GEOMETRY
AND COMPOSITION OF SYSTEM,
CAN GET PEAKS TO OCCUR AT
PRESET LEVELS,
E.G. ITU TARGET FREQUENCIES $\lambda_1$ IS AN ABSOLUTE FREQUENCY WHICH IS KNOWN FROM GEOMETRY AND COMPOSITION OF SYSTEM AND REFLECTIVE COATING ON MIRROR 2

WAVELENGTH REFERENCE DEVICE

REFERENCE TO PENDING PRIOR PATENT APPLICATION

This patent application claims benefit of pending prior U.S. Provisional Patent Application Ser. No. 60/150,241, filed Aug. 23, 1999 by Reich Watterson et al. for WAVELENGTH REFERENCE DEVICE, which patent application is hereby incorporated herein by reference.

FIELD OF THE INVENTION

This invention relates to photonic devices in general, and more particularly to tunable filters and tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 05, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable Fabry-Perot filter 5 formed in accordance with the aforementioned U.S. patent applications Ser. Nos. 09/105,399 and 09/543,318. Filter 5 generally comprises a substrate 10, a bottom mirror 20 mounted to the top of substrate 10, a bottom electrode 15 mounted to the top of bottom mirror 20, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, a Fabry-Perot filter is effectively created between top mirror 40 and bottom mirror 20. Furthermore, by applying an appropriate voltage across top electrode 30 and bottom electrode 15, the position of top mirror 40 can be changed relative to bottom mirror 20, whereby to change the length of the Fabry-Perot cavity, and hence tune Fabry-Perot filter 5.

Correspondingly, and looking next at FIG. 2, a tunable vertical cavity surface emitting laser (VCSEL) 50 can be constructed by positioning a gain medium 55 between bottom mirror 20 and bottom electrode 15. As a result, when gain medium 55 is appropriately stimulated, e.g., by optical pumping, lasing can be established within air cavity 45 and gain medium 55, between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune VCSEL 50.

Tunable Fabry-Perot filters and tunable VCSEL's of the type disclosed in the aforementioned U.S. patent applications Ser. Nos. 09/105,399 and 09/543,318 are highly advantageous since they can be quickly and easily tuned by simply changing the voltage applied across the top electrode and the bottom electrode.

However, it has been found that tunable Fabry-Perot filters and tunable VCSEL's of the type disclosed in U.S. patent applications Ser. Nos. 09/105,399 and 09/543,318 have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific frequency. This can present an issue in some applications, particularly telecommunications applications, where the devices may need to be tuned to precise, absolute wavelengths.

SUMMARY OF THE INVENTION

As a result, one object of the present invention is to provide a novel wavelength reference apparatus for calibrating a tunable Fabry-Perot filter and/or a tunable VSCEL, whereby the device may be tuned to a precise, absolute wavelength.

Another object of the present invention is to provide a novel wavelength-locking apparatus for tuning a tunable Fabry-Perot filter and/or a tunable VCSEL to a precise, absolute wavelength, and for thereafter keeping that device tuned to that wavelength.

Still another object of the present invention is to provide a novel method for calibrating a tunable Fabry-Perot filter and/or a tunable VSCEL, whereby the device may be tuned to a precise, absolute wavelength.

Yet another object of the present invention is to provide a novel method for wavelength-locking a tunable Fabry-Perot filter and/or a tunable VCSEL, whereby to tune the device to a precise, absolute wavelength, and for thereafter keeping that device tuned to that wavelength.

Still other objects will be apparent to those skilled in the art in view of the present disclosure.

In one form of the invention, there is provided a wavelength reference apparatus for use in calibrating a device such as a tunable Fabry-Perot filter or a tunable VCSEL to a precise, absolute frequency, the wavelength reference apparatus comprising a Michelson interferometer for splitting light emitted from the device over first and second optical paths and then recombining that light, a detector for detecting the recombined light received from the Michelson interferometer, and determining means for determining the absolute wavelength of the emitted light from the recombined light received by the detector.

In another form of the invention, there is provided a wavelength-locking apparatus for use in tuning a device such as a tunable Fabry-Perot filter or a tunable VCSEL to a precise, absolute frequency, the wavelength locking apparatus comprising a Michelson interferometer for splitting light emitted from the device over first and second optical paths and then recombining that light, a detector for detecting the recombined light received from the Michelson interferometer, determining means for determining the absolute wavelength of the emitted light from the recombined light received by the detector, and a controller for tuning the device by monitoring the absolute wavelength of the emitted light as determined by the determining means and providing feedback to the device.

In yet another form of the invention, there is provided a method for tuning a tunable Fabry-Perot filter or a tunable VCSEL, comprising the steps of: splitting light emitted from the device along first and second optical paths, wherein at least one of the paths includes passing the light through a wavelength selective element; recombining the light from the first and second optical paths onto a detector; and analyzing an output signal generated by the detector to determine the wavelength of light emitted from the device.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
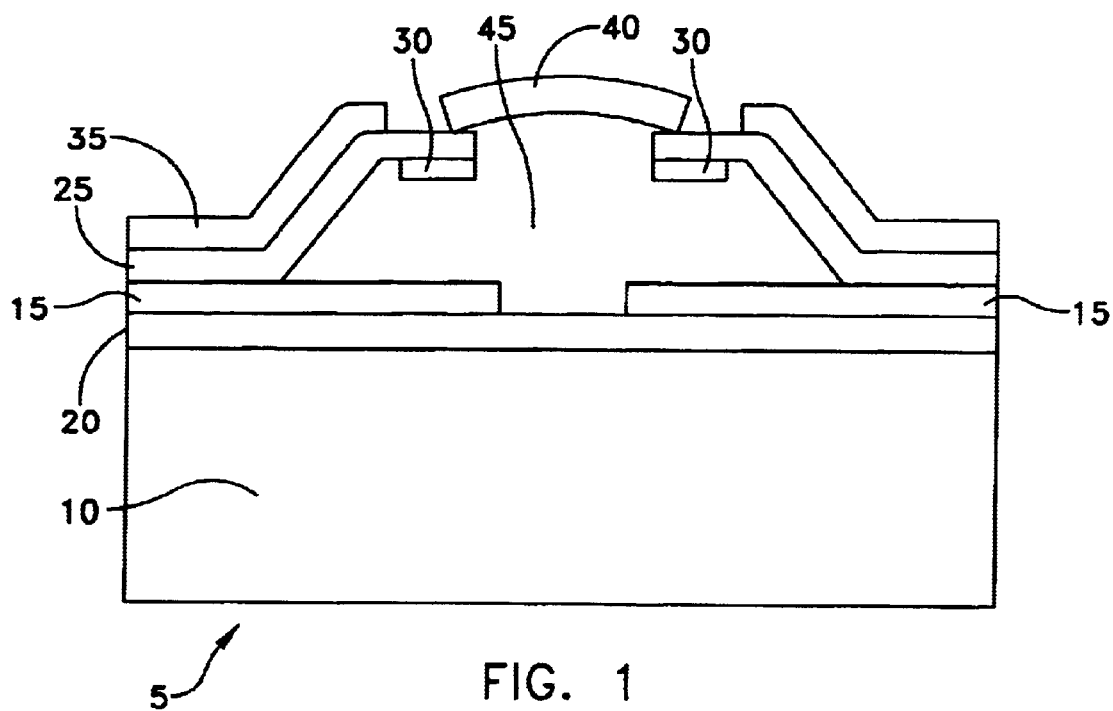
FIG. 1 is a schematic side view of a tunable Fabry-Perot filter.
Figure 2:
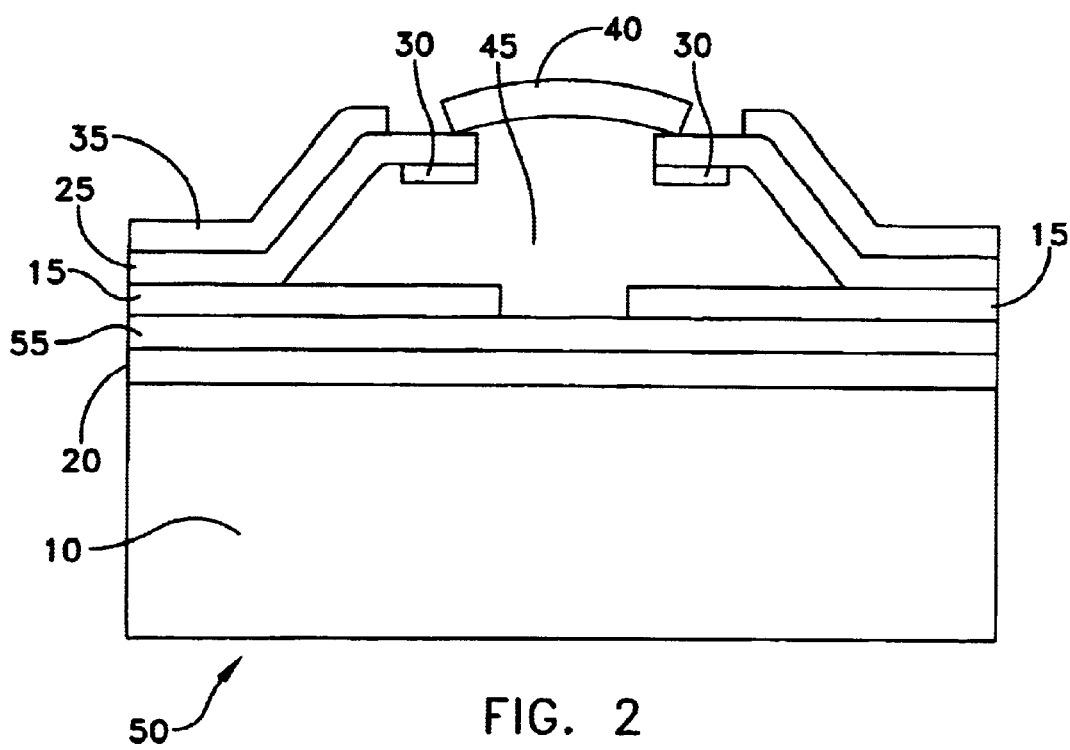
FIG. 2 is a schematic side view of a tunable VCSEL.
Figure 3:
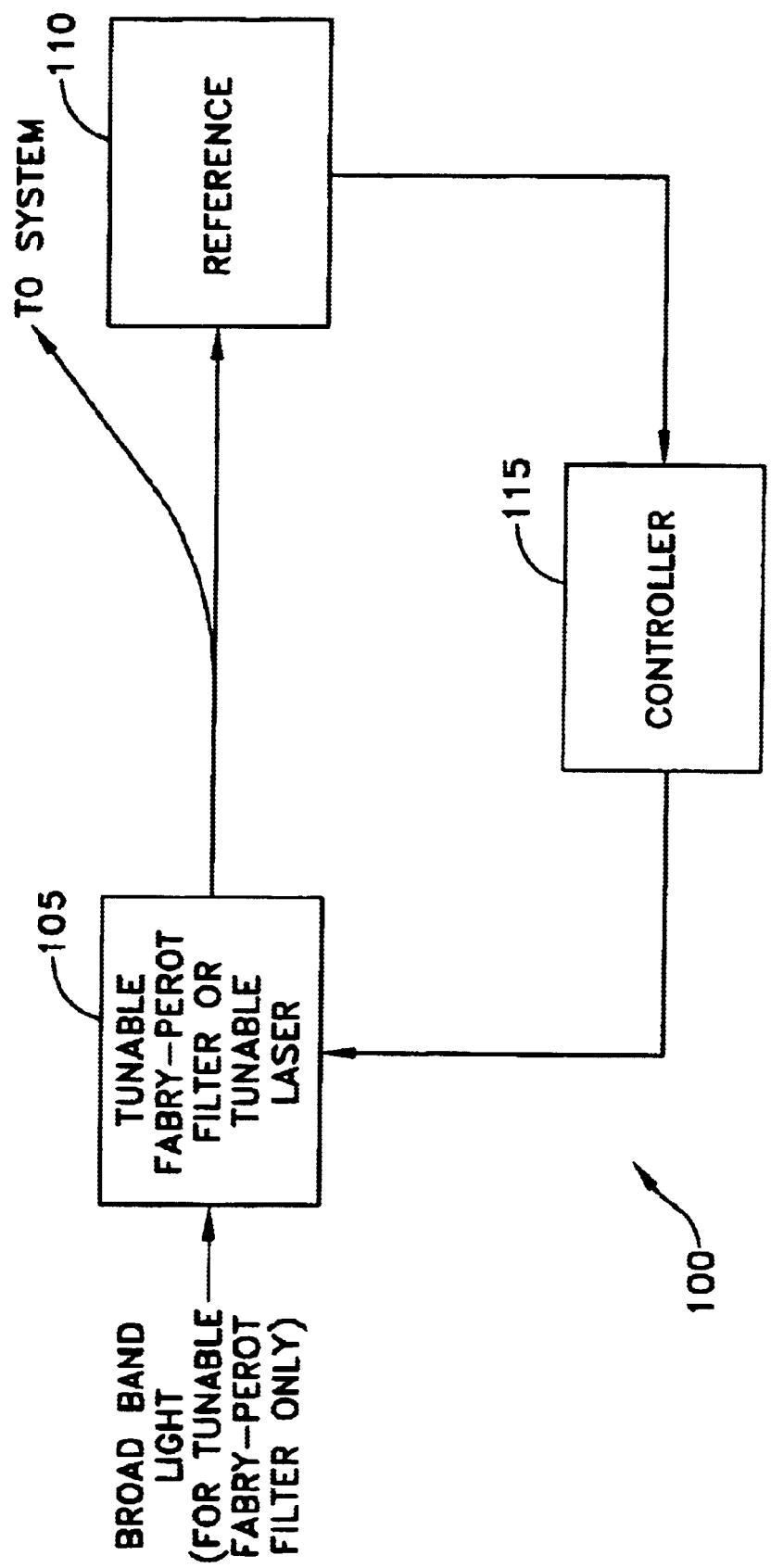
FIG. 3 is a schematic diagram of wavelength reference apparatus and wavelength-locking apparatus for tuning a tunable Fabry-Perot filter and/or a tunable VCSEL to a desired frequency, and for thereafter keeping that device tuned to that frequency.

Looking next at FIG. 3, there is shown a system 100 which comprises a wavelength reference apparatus for calibrating a tunable Fabry-Perot filter and/or a tunable VCSEL, whereby the device may be tuned to a precise, absolute wavelength. System 100 also provides a wavelength-locking apparatus to keep the tunable Fabry-Perot filter and/or tunable VCSEL tuned to a precise, absolute wavelength.

More particularly, system 100 generally comprises a tunable Fabry-Perot filter or tunable VCSEL 105, a wavelength reference apparatus 110, and a controller 115.

Tunable Fabry-Perot filter or tunable VCSEL 105 preferably comprises a tunable Fabry-Perot filter or tunable VCSEL of the type disclosed in U.S. patent applications Ser. Nos. 09/105,399 and 09/543,318. For convenience of description, tunable device 105 will hereinafter be described in the context of being a tunable VCSEL; however, it will be appreciated that the present invention is equally applicable to the situation where tunable device 105 comprises a tunable Fabry-Perot filter. Of course, using wavelength reference device 110 with a tunable Fabry-Perot filter would require that the tunable filter be illuminated by an external broad band light source (see FIG. 3). This broad band light source could be either optically combined with, or switched with, a normal incoming light signal.

Wavelength reference device 110 is adapted to provide multiple precise reference wavelengths over the wavelength region of interest. These precise reference wavelengths may be located on the ITU grid. In accordance with a preferred embodiment of the invention, and looking now at FIG. 4, wavelength reference device 110 comprises a beam splitter 120, a first mirror 125, a second mirror 130, and a detector 140, as will hereinafter be discussed in further detail.

Controller 115 comprises circuitry for reading the output of detector 140 and adjusting the voltage applied to VCSEL 105 so as to tune VCSEL 105 to the desired wavelength, and to thereafter keep it tuned to that wavelength, as will hereinafter be discussed in further detail.

Figure 4:
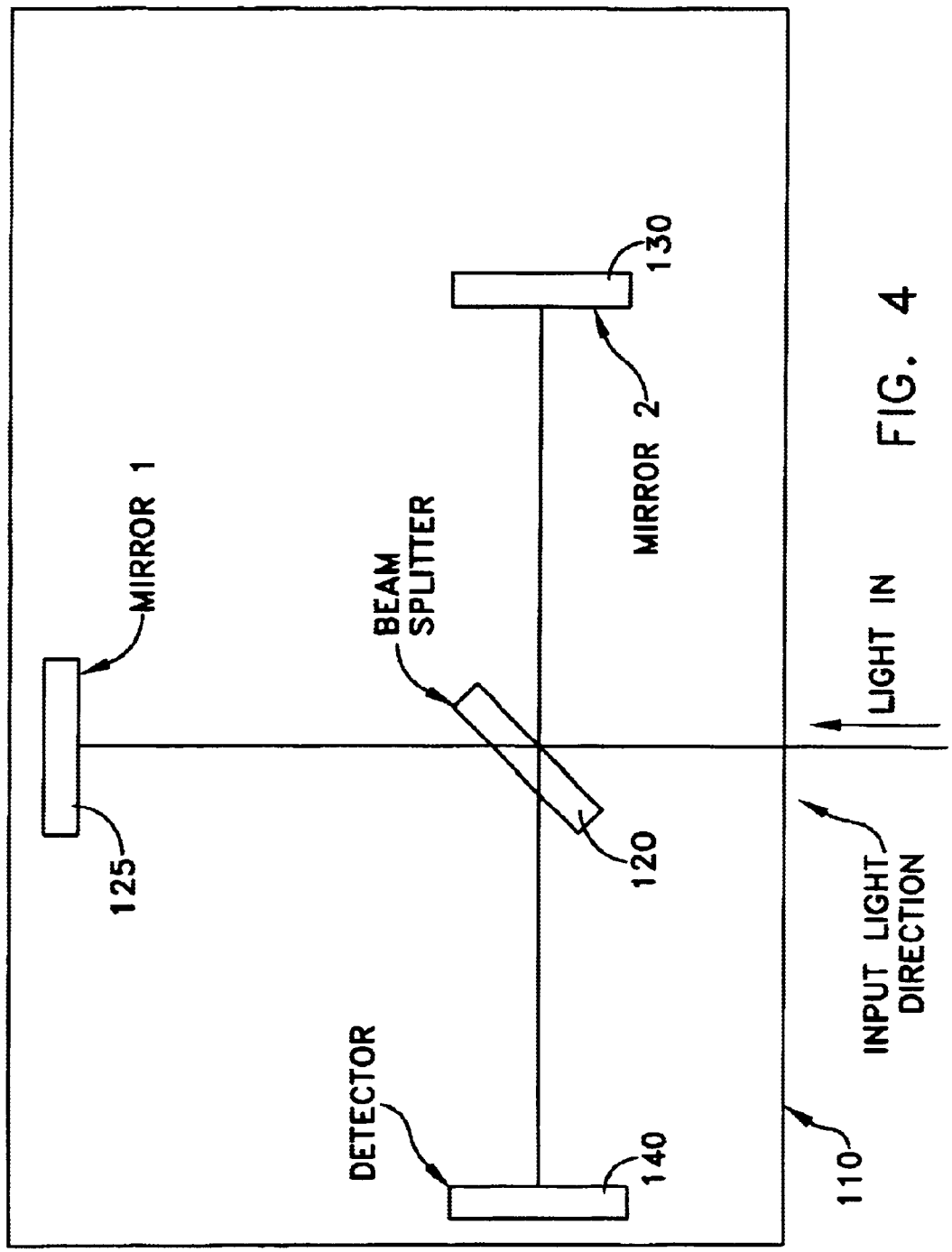
FIG. 4 is a schematic diagram of wavelength reference apparatus formed in accordance with the present invention.
Figure 5:
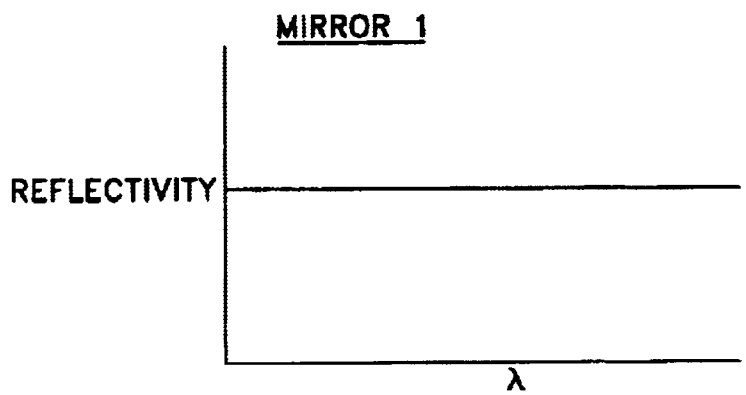
FIGS. 5 and 6 show possible reflectivity profiles for the system's first and second mirrors, respectively.
Figure 6:
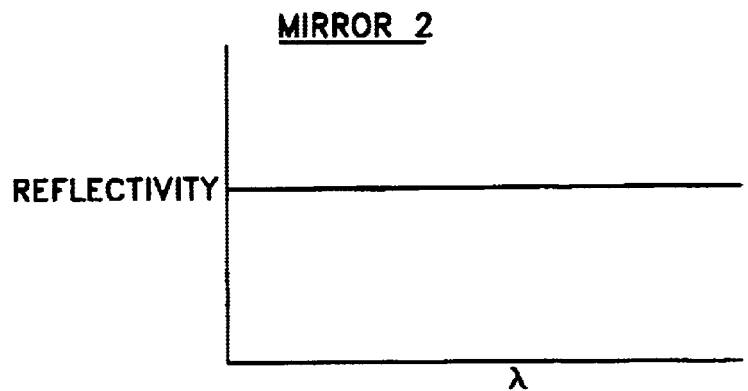

In essence, the optical arrangement of FIG. 4 is generally similar to that of a traditional Michelson interferometer. Thus, when first mirror 125 has a reflectivity profile as shown in FIG. 5 and second mirror 130 has a reflectivity profile as shown in FIG. 6, and when light is input into beam splitter 120 in the manner shown in FIG. 4, the light will be split by beam splitter 120 into two paths: a first path passing through beam splitter 120, bouncing off first mirror 125, bouncing off beam splitter 120, and then encountering detector 140; and a second path bouncing off beam splitter 120, bouncing off second mirror 130, passing back through beam splitter 120, and then encountering detector 140. The light from the two paths will recombine and be received by detector 140.

In accordance with the function of Michelson interferometers, as the wavelength of the light entering the system is monotonically swept, the recombined light received by detector 140 will have, due to wave interference, an intensity profile such as that shown in FIG. 5.

Figure 7:
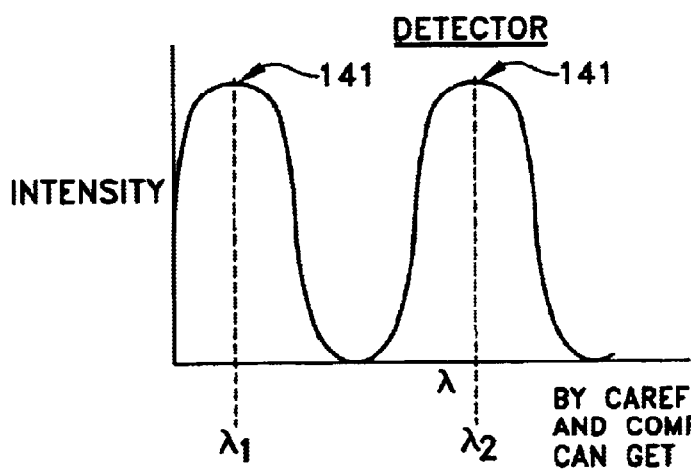
FIG. 7 shows a possible intensity profile for light received by the system's detector, where the system's first and second mirrors have the reflectivity profiles shown in FIGS. 5 and 6, respectively.

By paying careful attention to the geometry and composition of the system's components, the wavelength reference device 110 can be fabricated so that its intensity peaks 141 (FIG. 7) occur at selected predetermined wavelengths, e.g., ITU target frequencies.

The present invention also provides a way to determine an absolute reference frequency.

More particularly, by providing one or both of first mirror 125 and/or second mirror 130 with a reflectivity coating such that only light within a defined wavelength range is reflected, it is possible to generate an intensity profile at detector 140 which will permit an absolute wavelength to be readily identified.

Figure 8:
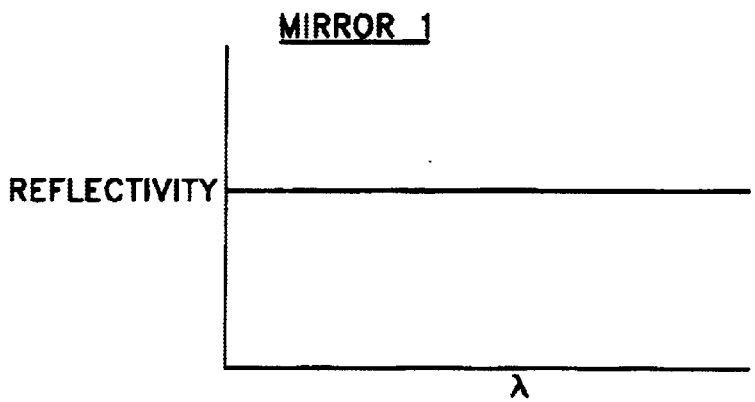
FIGS. 8 and 9 show other possible reflectivity profiles for the system's first and second mirrors, respectively.
Figure 9:
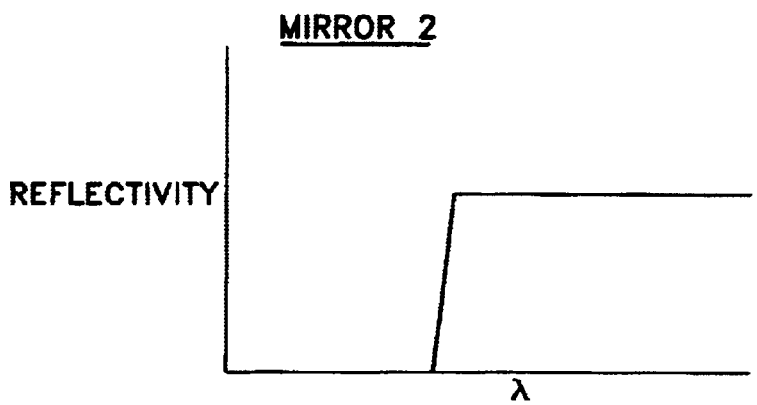
Figure 10:
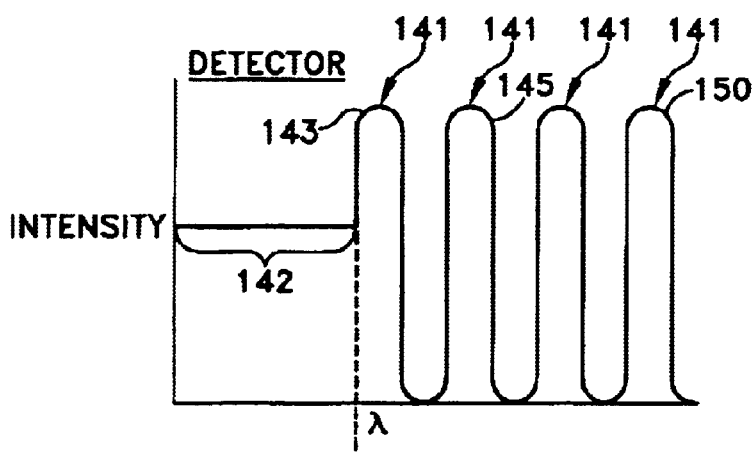
FIG. 10 shows a possible intensity profile for light received by the system's detector, where the system's first and second mirrors have the reflectivity profiles shown in FIGS. 8 and 9, respectively.

Thus, by forming first mirror 125 with a reflectivity profile such as that shown in FIG. 8, and by forming second mirror 130 with a reflectivity profile such as that shown in FIG. 9 (i.e., by adding an appropriate reflective coating to second mirror 130), the recombined light received by detector 140 will have the intensity profile shown in FIG. 10, i.e., a range 142 of relatively constant intensity, followed by a series of peaks 141 falling on the ITU's target frequencies. At the same time, the absolute frequency of the intensity profile's first peak 143 will be known, since it will be a function of the geometry and composition of the system's elements and the specific reflectivity coating applied to second mirror 130. As a result, once this accurate single frequency 143 is known from the system, the system's intensity peaks 141 can be used to tune VCSEL 105 to a desired target frequency.

In essence, and looking now at FIGS. 4 and 10, wavelength reference device 110 is used to generate a pattern of optical reflectance peaks 141. This is done by sweeping the frequency of the light input to the interferometer in a monotonic manner, either by changing the frequency of the source (i.e., VCSEL 105) or by tuning a tunable optical filter inserted in the optical path. The optical reflectance peaks 141 of the interferometer occur at precise, absolute wavelengths according to the specific construction of interferometer. The interferometer is preferably constructed so that the spacing between the transmission peaks 141 generated by the interferometer is the same as the spacing of the desired target frequencies (e.g., the ITU reference grid). As a result, once a single reflectance peak 141 is identified among the interferometer's reflectance peaks, the interferometer's reflectance peaks can then be used to tune VCSEL 105 to a desired target frequency.

In the present invention, by forming one or both of first mirror 125 and/or second mirror 130 with a selected reflective coating, where that selected reflective coating causes only light within a defined wavelength range to be reflected, the interferometer's reflectance peaks can have a tailored profile which permits ready identification of a single absolute frequency.

A peak detection circuit (in the form of controller 115) monitors the optical signal falling on detector 140 as the frequency of VCSEL 105 is swept in response to a voltage provided by the circuit. The detected peaks 141 are first used to identify the single absolute frequency. The device can thereafter be tuned to the desired frequency by changing the tuning voltage in such a manner as to either increase or decrease the peak count number to that corresponding to the desired ITU frequency as determined above.

By way of example but not limitation, and looking now at FIGS. 3, 4 and 10, suppose that at a given voltage X, VCSEL 105 is generating light with a frequency Y such that wavelength reference device 110 is generating the specific transmission peak 145. Suppose further that it is desired to tune VCSEL 105 so that it is generating light at the ITU frequency 150. In this case, the voltage being applied to VCSEL 105 is adjusted so that the peak detection circuit detects two (2) reflectance transmission peaks, whereupon VCSEL 105 will be generating light at the desired ITU frequency 150. Correspondingly, if detector 140 is at the transmission peak 145 and it is desired to tune VCSEL 105 to the ITU frequency 143, the voltage being applied to VCSEL 105 is adjusted so that the peak detection circuit counts one (1) reflectance transmission peak, whereupon VCSEL 105 will be generating light at the desired ITU frequency 143.

Furthermore, once VCSEL 105 has been tuned to the desired target frequency, the output of detector 140 can be monitored; if this output drifts off the desired transmission peak (i.e., indicating that VCSEL 105 has drifted off the desired target frequency), the system can adjust the voltage being applied to VCSEL 105 so as to bring the VCSEL back to the desired frequency by driving the output back to the desired transmission peak.

It is, of course, possible to apply the aforementioned reflective coating to both first mirror 125 and second mirror 130. Thus, for example, where first mirror 125 has a reflectivity profile as shown in FIG. 11 and second mirror 130 has a reflectivity profile as shown in FIG. 12, the light falling on detector 140 will have the intensity profile shown in FIG. 13.

Figure 11:
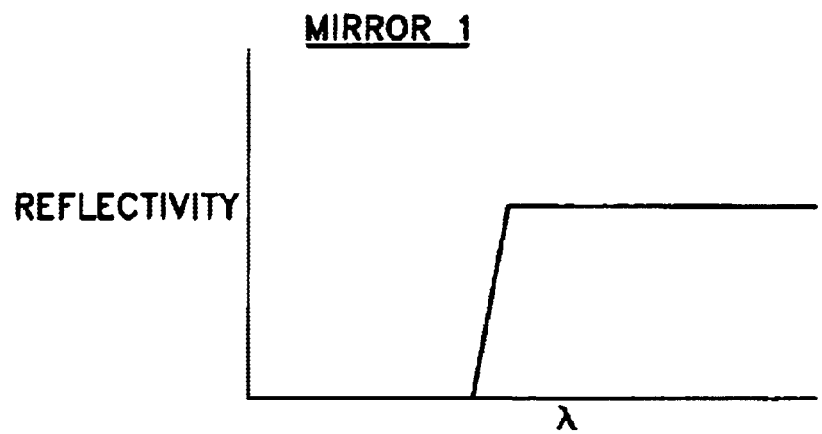
FIGS. 11 and 12 show still other possible reflectivity profiles for the system's first and second mirrors, respectively.
Figure 12:
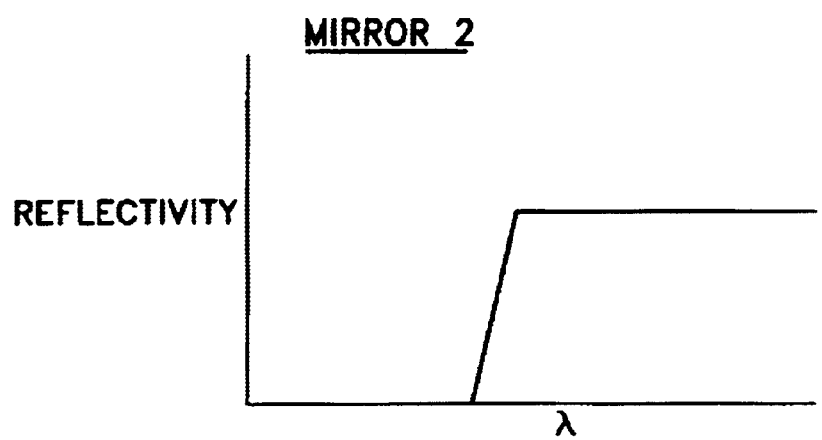
Figure 13:
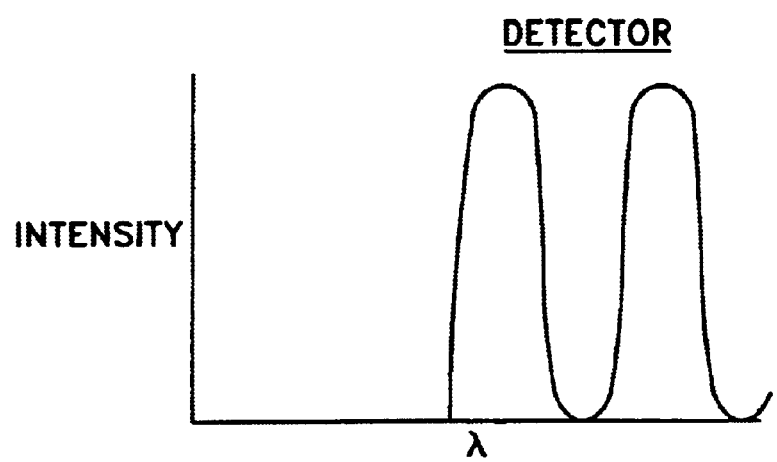
FIG. 13 shows a possible intensity profile for light received by the system's detector, where the system's first and second mirrors have the reflectivity profiles shown in FIGS. 11 and 12, respectively.
Figure 14:
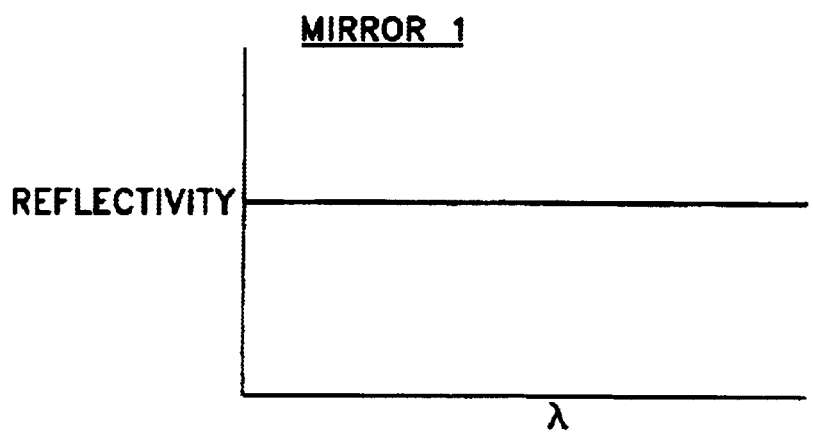
FIGS. 14 and 15 show other possible reflectivity profiles for the system's first and second mirrors, respectively.
Figure 15:
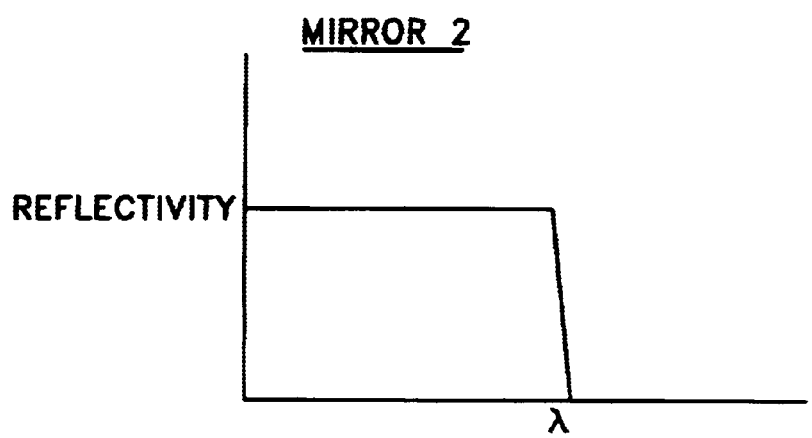
Figure 16:
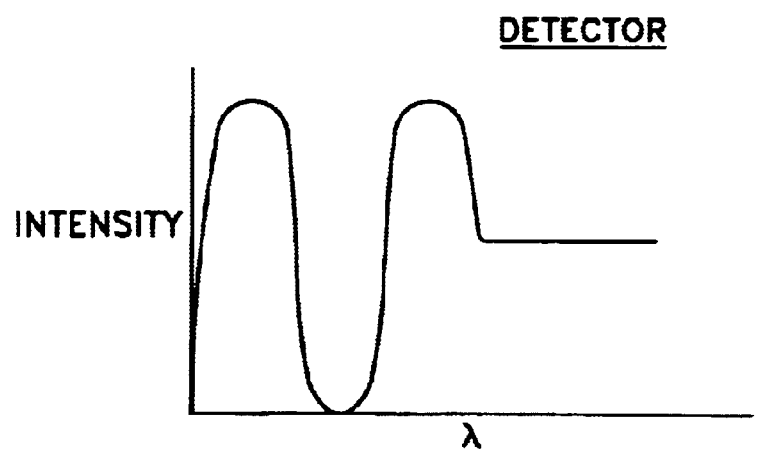
FIG. 16 shows a possible intensity profile for light received by the system's detector, where the system's first and second mirrors have the reflectivity profiles shown in FIGS. 14 and 15, respectively.

It will be appreciated that with the reflectivity profiles shown in FIGS. 9, 11 and 12, the reflectivity profiles drop off at lower wavelengths. Alternatively, it is possible to form the system so that one or more of the mirrors has a reflectivity profile which drops off at higher wavelengths. By way of example, where first mirror 125 has in the reflectivity profile shown in FIG. 14 and where second mirror 130 has in the reflectivity profile shown in FIG. 15, the light falling on detector 140 will have the intensity profile shown in FIG. 16.

Figure 17:
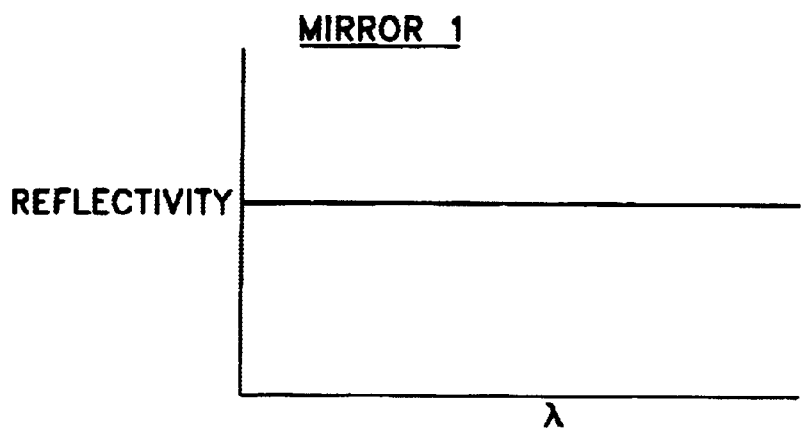
FIGS. 17 and 18 show still other possible reflectivity profiles for the system's first and second mirrors, respectively.
Figure 18:
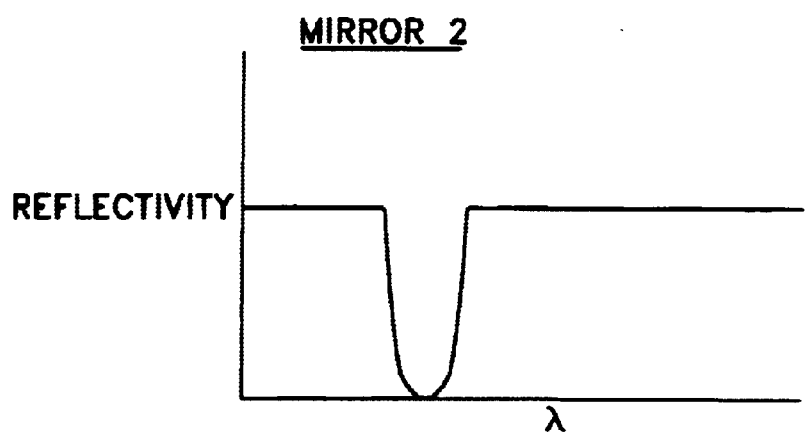
Figure 19:
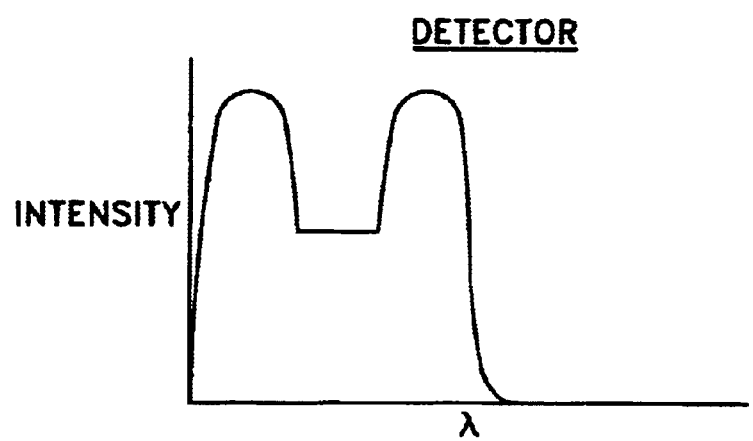
FIG. 19 shows a possible intensity profile for light falling on the system's detector, where the system's first and second mirrors have the reflectivity profiles shown in FIGS. 17 and 18, respectively.

Additionally, it is also possible to form the system so that one or more of the mirrors has a reflectivity profile which drops off at intermediate wavelengths. By way of example, where first mirror 125 has the reflectivity profile shown in FIG. 17 and where second mirror 130 has the reflectivity profile shown in FIG. 18, the light falling on detector 140 will have the intensity profile shown in FIG. 19.

Numerous advantages are achieved through the use of the present invention.

For one thing, an effective optical wavelength reference is provided in an extremely compact physical layout.

In addition, a simple electronics drive circuit is used, which uses peak counting to locate frequencies.

It is to be understood that the particular constructions and method steps disclosed above and/or shown in the drawing are provided by way of example but not limitation. Thus, it should be appreciated that the present invention is by no means limited to the particular constructions and method steps disclosed above and/or shown in the drawings, but also comprises any modifications or equivalents within the scope of the claims.

What is claimed is:

1. A wavelength reference apparatus for use in calibrating a device comprising a tunable Fabry-Perot cavity to a precise, absolute frequency, the wavelength reference apparatus comprising:

a Michelson interferometer for splitting light emitted from the device over first and second optical paths and then recombining that light;

a detector for detecting the recombined light received from the Michelson interferometer; and determining means for determining the absolute wavelength of the emitted light from the recombined light received by the detector.

2. A wavelength reference apparatus according to claim 1 wherein the Michelson interferometer comprises a beam splitter and first and second mirrors.

3. A wavelength reference apparatus according to claim 2 further comprising a wavelength selective element.

4. A wavelength reference apparatus according to claim 2 wherein at least one of the first and second mirrors is coated with a reflective coating which causes only light within a defined wavelength range to be reflected.

5. A wavelength reference apparatus according to claim 4 wherein both of the first and second mirrors are coated with a reflective coating which causes only light within a defined wavelength range to be reflected.

6. A wavelength reference apparatus according to claim 5 wherein the reflective coatings for the first and second mirrors both reflect light over the same wavelength range.

7. A wavelength reference apparatus according to claim 5 wherein the reflective coatings for the first and second mirrors each reflect light over different but overlapping wavelength ranges.

8. A wavelength reference apparatus according to claim 3 wherein the wavelength selective element is a dielectric filter.

9. A wavelength reference apparatus according to claim 1 wherein the determining means includes a look-up table.

10. A wavelength reference apparatus according to claim 9 wherein the determining means further comprises interpolation of the look-up table values.

11. A wavelength reference apparatus according to claim 1 further comprising at least one of the first and second optical paths having an etalon therein, wherein the at least one etalon in the at least one of the first and second optical paths denotes a particular wavelength therethrough.

12. A wavelength-locking apparatus for use in tuning a device comprising a tunable Fabry-Perot cavity to a precise, absolute frequency, the wavelength locking apparatus comprising:
   a Michelson interferometer for splitting light emitted from the device over first and second optical paths and then recombining that light;
   a detector for detecting the recombined light received from the Michelson interferometer;
   determining means for determining the absolute wavelength of the emitted light from the recombined light received by the detector; and
   a controller for tuning the device by monitoring the absolute wavelength of the emitted light as determined by the determining means and providing feedback to the device.

13. A wavelength-locking apparatus according to claim 12 wherein feedback from the detector to the device is provided through an electronic feedback circuit.

14. A method for tuning a device comprising a tunable Fabry-Perot comprising:
   (1) splitting light emitted from the device along first and second optical paths, wherein at least one of the paths includes passing the light through a wavelength selective element;
   (2) recombining the light from the first and second optical paths onto a detector; and
   (3) analyzing an output signal generated by the detector to determine the wavelength of light emitted from the device.

15. A system comprising:
   a tunable filter; and
   a wavelength-locking apparatus for use in tuning the tunable filter to a precise, absolute frequency, the wavelength locking apparatus comprising:
      a Michelson interferometer for splitting light emitted from the filter over first and second optical paths and then recombining that light;
      a detector for detecting the recombined light received from the Michelson interferometer;
      determining means for determining the absolute wavelength of the emitted light from the recombined light received by the detector; and
      a controller for tuning the filter by monitoring the absolute wavelength of the emitted light as determined by the determining means and providing feedback to the filter.

16. A system comprising:
   a tunable VCSEL; and
   a wavelength-locking apparatus for use in tuning the tunable VCSEL to a precise, absolute frequency, the wavelength locking apparatus comprising:
      a Michelson interferometer for splitting light emitted from the VCSEL over first and second optical paths and then recombining that light;
      a detector for detecting the recombined light received from the Michelson interferometer;
      determining means for determining the absolute wavelength of the emitted light from the recombined light received by the detector; and
      a controller for tuning the VCSEL by monitoring the absolute wavelength of the emitted light as determined by the determining means and providing feedback to the VCSEL.

* * * * *